United States Patent
Yang

(10) Patent No.: US 6,624,092 B2
(45) Date of Patent: Sep. 23, 2003

(54) METHOD FOR FORMING LOW DIELECTRIC CONSTANT INSULATING LAYER WITH FOAMED STRUCTURE

(75) Inventor: Tahorng Yang, Hsinchu (TW)

(73) Assignee: Macronix International Co., Ltd., Hsinchu (TW)

(*) Notice: Subject to any disclaimer, the term of this patent is extended or adjusted under 35 U.S.C. 154(b) by 13 days.

(21) Appl. No.: 09/895,550

(22) Filed: Jun. 28, 2001

(65) Prior Publication Data

US 2003/0003769 A1 Jan. 2, 2003

(51) Int. Cl.[7] .............................................. H01L 21/31
(52) U.S. Cl. ........................ 438/778; 438/780; 438/760
(58) Field of Search ................................ 438/778, 780, 438/760

(56) References Cited

U.S. PATENT DOCUMENTS

| | | | | |
|---|---|---|---|---|
| 3,843,745 A | * | 10/1974 | Christman et al. ............. 502/306 |
| 3,937,748 A | * | 2/1976 | Miklas ............................ 585/433 |
| 4,652,467 A | * | 3/1987 | Brinker et al. .................. 427/162 |
| 4,704,299 A | * | 11/1987 | Wielonski et al. ............ 427/397.7 |
| 5,078,919 A | * | 1/1992 | Ashley et al. ................. 250/361 R |
| 5,470,802 A | * | 11/1995 | Gnade et al. .................... 438/781 |
| 5,753,305 A | * | 5/1998 | Smith et al. .................... 427/245 |
| 5,847,443 A | * | 12/1998 | Cho et al. ....................... 257/632 |
| 5,875,564 A | * | 3/1999 | Kirkbir et al. .................... 34/305 |
| 5,879,744 A | * | 3/1999 | Cao et al. ....................... 427/244 |
| 5,882,801 A | * | 3/1999 | Beardsley et al. ............... 427/450 |
| 5,966,832 A | * | 10/1999 | Kirkbir et al. ..................... 34/79 |
| 6,063,714 A | * | 5/2000 | Smith et al. .................... 427/335 |
| 6,140,252 A | * | 10/2000 | Cho et al. ..................... 106/164.44 |
| 6,171,645 B1 | * | 1/2001 | Smith et al. .................... 427/344 |
| 6,306,216 B1 | * | 10/2001 | Kim et al. ....................... 118/715 |
| 6,329,062 B1 | * | 12/2001 | Gaynor ........................... 423/335 |
| 6,333,215 B1 | * | 12/2001 | Matsuda et al. ................ 438/149 |
| 6,341,572 B1 | * | 1/2002 | Howell et al. ................ 114/230.12 |
| 6,342,128 B1 | * | 1/2002 | Tabatabaie-Raissi et al. .... 204/157.15 |
| 6,376,634 B1 | * | 4/2002 | Nishikawa et al. ............ 106/287.1 |
| 2002/0042210 A1 | * | 4/2002 | Mandal et al. .................. 438/780 |

* cited by examiner

Primary Examiner—Matthew Smith
Assistant Examiner—V. Yevsikov
(74) Attorney, Agent, or Firm—J.C. Patents

(57) ABSTRACT

A method is used to form an insulating layer with foamed structure. About the method, a gel layer over a substrate, where the gel layer includes several types of solution, an unextractable material, and a solvent. The substrate is then put in a closed pressure chamber. The closed pressure chamber is heated to a subcritical temperature with respect to the material which is included in the gel layer but to be extracted out. In this situation, liquid and the material to be extracted all turn to a vapor phase due to the pressure in the pressure chamber has reached the subcritical pressure, whereby materials are extracted. Under this temperature, the vapor is flushed away, and a noble gas is flushed into the pressure chamber for cleaning. The substrate with the gel layer is cooled down to the environmental temperature. Then the substrate is taken out from the pressure chamber.

19 Claims, 2 Drawing Sheets

METHOD FOR FORMING LOW DIELECTRIC CONSTANT INSULATING LAYER WITH FOAMED STRUCTURE

BACKGROUND OF THE INVENTION

1. Field of Invention

The present invention relates to a method for forming an insulating layer with low dielectric constant. More particularly, the present invention relates to a method for forming an insulating layer with foamed structure.

2. Description of Related Art

In order to satisfy the requirement of interconnect after the size of metal-oxide semiconductor transistor is greatly reduced, the interconnect structure designed with multiple metal layers has been the usual way in integrated circuit. Particularly, for a powerful microprocessor, it usually needs four, five, or even more metal layers, so as to accomplish the interconnect structure. This kind of multilevel interconnect needs several insulating layers between for insulating the metal layers, preventing short circuit in the multilevel interconnect.

The spin-on glass (SOG) process is one of conventional methods to form an insulating layer. The SOG process includes a dielectric material which is solved in a solvent as a solution. The solution with dielectric material is coated over a wafer by a pin coating manner, and then the wafer is put on a hot plate for baking, so as to cure the SOG, while the solvent in the solution is evaporated away. After the first stage of curing on the hot plate, the wafer is transferred into a furnace for the final stage of curing.

However, as the size of interconnect is further reduced following fabrication trend, the back-end of line is narrowed, causing a phenomenon of metal line delay. The metal line delay is a severe issue in operation of integrated circuit. This is because when the line width of interconnect is getting narrow, the parasitic capacity is getting more effect and further causing time delay, and even more causing power consumption resulting in raising temperature on the wafer. In this consideration, it is strongly desired that the insulating layer needs smaller dielectric constant.

SUMMARY OF THE INVENTION

The invention provides a method to form an insulating layer with foamed structure, so that the dielectric constant is further reduced. Therefore, it is suitable for use in the more and more complicate device design.

The invention provides a method for forming an insulating layer with a foamed structure. The method uses a subcritical drying process to form the insulating layer with foamed structure. The method includes coating a gel layer over a substrate, where the gel layer includes several types of solution, an unextractable material, and a solvent. A subcritical drying process is performed to extract a to-be-extracted material in the gel layer, so that the gel layer is transformed into the insulating layer with the foamed structure. The foamed structure can reduce the dielectric constant.

Moreover, the subcritical dry mechanism is related to the control between temperature and pressure, so that some extractable materials exited in the polymer gel can be extracted leaving pores, whereby the unextractable material forms a layer with foamed structure, also called porous structure. The temperature and the pressure are set at the critical levels in the three-phase diagram for the extracted material.

Since the invention has employed the subcritical drying process to form the insulating layer with foamed structure, the dielectric constant further lower than that of the conventional low dielectric constant insulating layer. Since the invention uses the subcritical drying process to form the foamed structure, the dimension of each pore un the foamed structure is more uniform. This also allows the electrical transmission between device to be more efficient.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
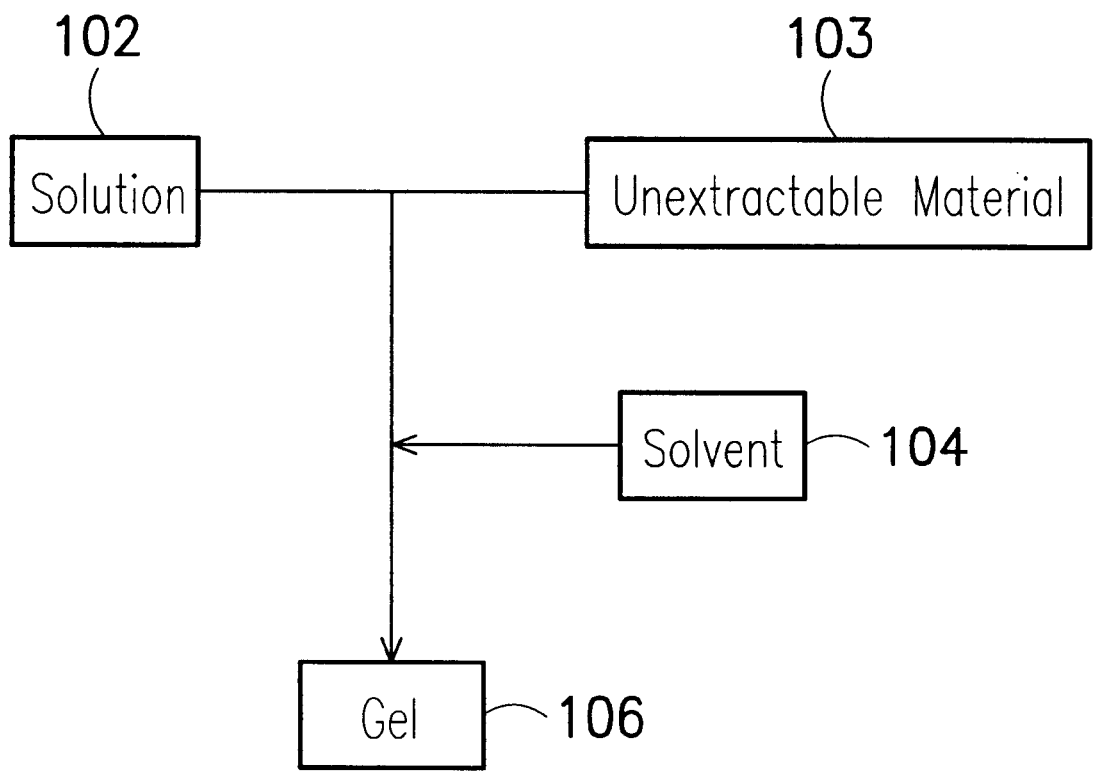
FIG. 1 is a fabrication flow for preparing a gel material used for forming an insulating layer with foamed structure, according to a preferred embodiment of the invention.

FIG. 1 is a fabrication flow for preparing a gel material used for forming an insulating layer with foamed structure, according to a preferred embodiment of the invention. In FIG. 1, a solution 102 and an unextractable material 103 are mixed. The solution 102 includes, for example, teraethyl orthosilicate (TEOS), ethanol, deionized water, and catalyst. The catalyst can include, for example, a mixed solution of hydrofluoric acid or hydrochloric acid. The unextractable material 103 includes, for example, silicon oxide or germanium oxide. The solution 102 is then further added with a solvent 104. As a result a gel material 106 is formed. The solvent 104 includes, for example, ethyl alcohol, iso-butanol, 2-pentanol, or 2,2,4-trimethylpentane.

Figure 2:
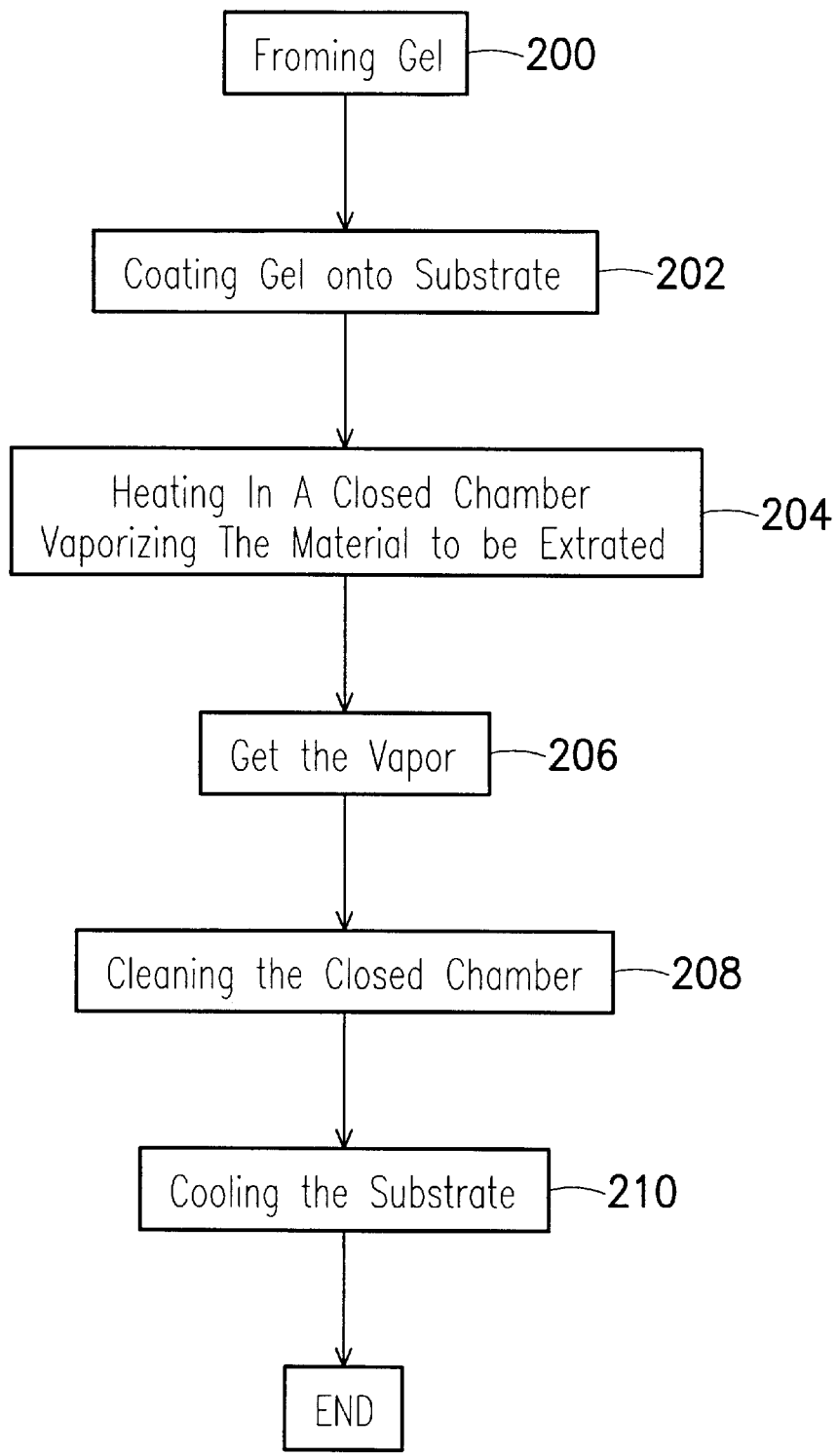
FIG. 2 is a fabrication flow for forming an insulating layer with foamed structure, according to a preferred embodiment of the invention, according to the preferred embodiment of this invention.

FIG. 2 is a fabrication flow for forming an insulating layer with foamed structure, according to a preferred embodiment of the invention, according to the preferred embodiment of this invention.

In FIG. 2, the processing for forming a low dielectric constant insulating layer with foamed structure includes a step 200 of forming a gel material by mixing a solution, an unextractable material and a solvent. The solvent is used to solve the unextractable material in the solution. Then, the gel material is formed.

in the step 202, the gel material is coated over a substrate to form a gel layer, where the substrate may have a device already formed thereon. Then, the substrate with the gel layer is put in a closed pressure chamber. The closed chamber includes, for example, pressure chamber.

in the step of 204, the closed chamber is heated up to a subcritical temperature with respect to the material to be extracted. The subcritical temperature is determined according to the three-phase diagram. As a result, the material to be extracted in the gel layer is vaporized into vapor phase. The heating rate on the closed chamber is, for example, 2° C. to 60° C. per hour, where 2° C. to 10° C. per hour is preferred. Since the material to be extracted has turned into vapor phase for extraction, the pressure level in the closed chamber is also at the subcritical pressure. At this moment, the gel layer coated on the substrate becomes a layer having foamed structure. The gel layer with pores serves as an insulating layer that has further lower dielectric constant that that of the conventional low dielectric constant material.

In the step of 206, the vapor in the closed chamber is flushed away, where the temperature in the closed chamber preferably is kept at a constant temperature. The constant temperature is not necessary to be the subcritical temperature. Furthermore, the pressure level in the closed chamber is gradually reducing up the environmental pressure during removing the vapor.

In the step of 208, the closed chamber is cleaned by, for example, flushing inert gas for at least 1 minute. The inert gas includes, for example, nitrogen.

In step of 210, the substrate is cooled to the zoom temperature, and is taken out from the closed chamber. According to the above process flow, to form the foamed structure, the liquid material to be extracted is smoothly and slowly vaporized out due to the temperature is set at the subcritical temperature. Therefore, the pores of the foamed structure are formed with a uniform dimension with narrow variation.

In summary, the invention has several advantages as follows:

1. The invention uses the subcritical drying process to form the insulating layer with foamed structure. Since the insulating layer has pores, the dielectric constant is further reduced, comparing with the conventional method.

2. The invention uses the subcritical drying process to form the insulating layer with foamed structure. The dimension of pores in the insulating layer is more uniform with narrow variation. This gives a better electrical transmitting efficiency between devices.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A method for forming an insulating layer on semiconductor devices with a foamed structure, the method comprising:

providing a substrate;

coating a gel layer over the substrate, wherein the gel layer comprises a mixed materials of a plurality of solutions, an unextractable material, and a solvent; and performing a subcritical drying process to extract a to-be-extracted material in the gel layer, so that the gel layer is transformed into the insulating layer with the foamed structure whereby a dielectric constant of the insulating layer is reduced.

2. The method of claim 1, wherein the step of performing the subcritical drying process comprises:

providing a closed chamber;

putting the substrate in the closed chamber;

heating the closed chamber to a subcritical temperature with respect to the to-be-extracted material, wherein a pressure level in the closed chamber is set to a subcritical pressure, whereby the to-be-extracted material is vaporized into a vapor; and removing the vapor in the closed chamber.

3. The method of claim 2, wherein the step of heating the closed chamber comprises a heating rate of 2° C.–60° C. per hour.

4. The method of claim 2, wherein the step of removing the vapor in the closed chamber is operated under a constant temperature.

5. The method of claim 2, wherein after the step of removing the vapor in the closed chamber, the method further comprises:

cleaning the closed chamber;

cooling the substrate; and taking out the substrate from the closed chamber.

6. The method of claim 5, wherein the step of cooling the substrate comprises cooling the substrate to a zoom temperature before being taken out from the closed chamber.

7. The method of claim 5, wherein the step of cleaning the closed chamber comprises flushing an inert gas for at least 1 minute.

8. The method of claim 7, wherein the inert gas comprises nitrogen.

9. The method of claim 1, wherein the solvent comprises ethanol.

10. The method of claim 1, wherein the solvent comprises iso-butanol.

11. The method of claim 1, wherein the solvent comprises 2-pentanol.

12. The method of claim 1, wherein the solvent comprises 2,2,4-trimethylpentane.

13. A method for forming an insulating layer with a foamed structure, the method comprising:

providing a substrate, having a device already formed thereon;

preparing a gel material by mixing a plurality of solutions, an unextractable material, and a solvent;

coating the gel material over the substrate to form a gel layer;

putting the substrate in a close chamber;

heating the closed chamber to a subcritical temperature with respect to a to-be-extracted material in the gel layer, wherein a pressure level in the closed chamber is also set to a subcritical pressure, whereby the to-be-extracted material is vaporized into a vapor; and removing the vapor from the closed chamber until the pressure level is reduced to an environmental pressure.

14. The method of claim 13, wherein the step of removing the vapor from the closed chamber is operated under a constant pressure.

15. The method of claim 13, wherein after the step of removing the vapor from the closed chamber, the method further comprises:

cleaning the closed chamber by an inert gas;

cooling the closed chamber until a zoom temperature, so that the gel layer is transformed into the insulating layer with the foamed structure; and taking out the substrate from the closed chamber.

16. The method of claim 15, wherein the step of cleaning the closed chamber comprise flushing an inert gas by at least 1 minute.

17. The method of claim 15, wherein the inert gas comprises nitrogen.

18. The method of claim 13, wherein the solvent comprises one selected from the group consisting of ethanol, iso-butanol, 2-pentanol, and 2,2,4-trimethylpentane.

19. The method of claim 13, wherein the step of heating the closed chamber comprises a heating rate of 2° C.–60° C. per hour.

* * * * *